United States Patent [19]

Shim et al.

[11] Patent Number: 5,864,470
[45] Date of Patent: Jan. 26, 1999

[54] FLEXIBLE CIRCUIT BOARD FOR BALL GRID ARRAY SEMICONDUCTOR PACKAGE

[75] Inventors: Il Kwon Shim; Young Wook Heo, both of Seoul, Rep. of Korea; Robert Francis Darveaux, Chandler, Ariz.

[73] Assignees: Anam Semiconductor Inc., Seoul, Rep. of Korea; Amkor Technology, Inc., Del.

[21] Appl. No.: 883,541

[22] Filed: Jun. 25, 1997

[30] Foreign Application Priority Data

| Dec. 30, 1996 | [KR] | Rep. of Korea | 1996 77900 |
| Dec. 30, 1996 | [KR] | Rep. of Korea | 1996 77901 |
| Dec. 30, 1996 | [KR] | Rep. of Korea | 1996 77902 |

[51] Int. Cl.$^6$ ........................................................ H05K 7/06
[52] U.S. Cl. ........................... 361/777; 361/719; 361/749; 361/767; 361/772; 257/691; 257/693; 257/713; 257/738; 174/254; 174/261; 174/268
[58] Field of Search ........................ 361/719, 720, 361/749, 767, 768, 772, 776, 777, 774; 257/691, 693, 697, 707, 713, 723, 738, 786, 676; 174/254, 255, 261, 268

[56] References Cited

U.S. PATENT DOCUMENTS

| 5,498,901 | 3/1996 | Chillara et al. | 257/666 |
| 5,543,657 | 8/1996 | Diffenderfer et al. | 257/666 |
| 5,640,047 | 6/1997 | Nakashima | 257/738 |
| 5,642,261 | 6/1997 | Bond et al. | 257/713 |
| 5,650,660 | 7/1997 | Barrow | 257/786 |
| 5,686,699 | 11/1997 | Chu et al. | 257/786 |
| 5,723,899 | 3/1998 | Shin | 257/666 |
| 5,739,588 | 4/1998 | Ishida et al. | 361/777 |

Primary Examiner—Gerald P. Tolin
Assistant Examiner—John B. Vigushin
Attorney, Agent, or Firm—Skjerven Morrill MacPherson Franklin and Friel LLP; Thomas S. MacDonald

[57] ABSTRACT

A flexible circuit board for a ball grid array semiconductor package including a flexible resin film, a plurality of electrically conductive traces formed on an upper surface of the resin film, the conductive traces having solder ball pads, and a die flag including a semiconductor chip paddle located on a central portion of the circuit board, the chip paddle having a plurality of heat-discharging and grounding solder ball pads, and a plurality of lattice-shaped traces adapted to electrically connect the solder ball pads, the traces being shaped into a lattice to prevent a bleed-out of a silver-filled epoxy resin, a ground bonding rim located around the chip paddle, and a plurality of radial traces adapted to electrically connect the chip paddle to the ground bonding rim, and the flexible resin film being perforated to define solder ball lands on lower surfaces of the solder ball pads. Since the semiconductor chip paddle has an enlarged opened portion, it is possible to minimize the gold plated region, thereby greatly reducing the manufacturing costs. It is also possible to minimize a deformation of the package caused by mechanical stress generated due to a difference in thermal expansion coefficient between different materials of package elements. A bleed-out of silver-filled epoxy resin is also surely prevented.

17 Claims, 7 Drawing Sheets

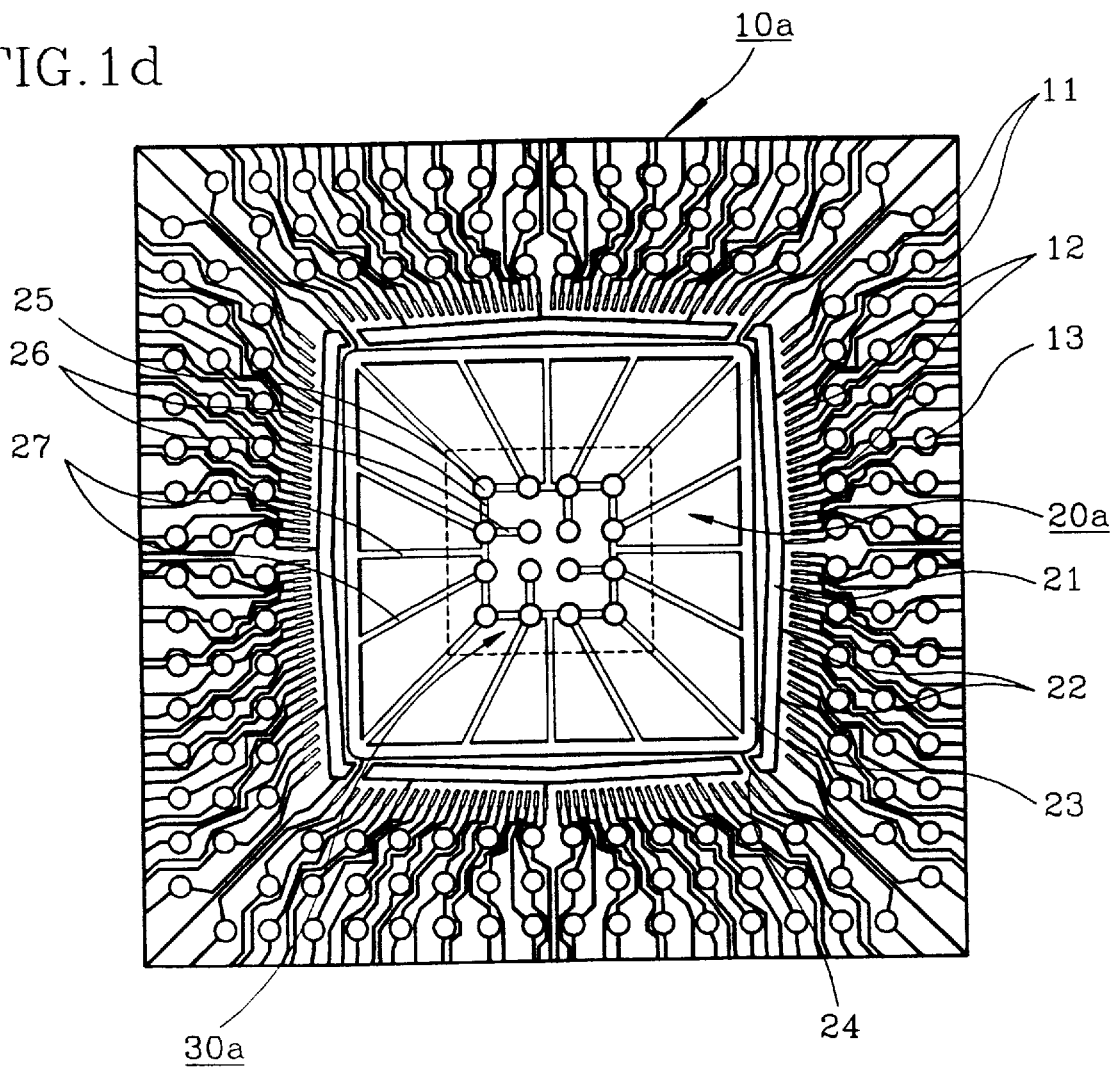

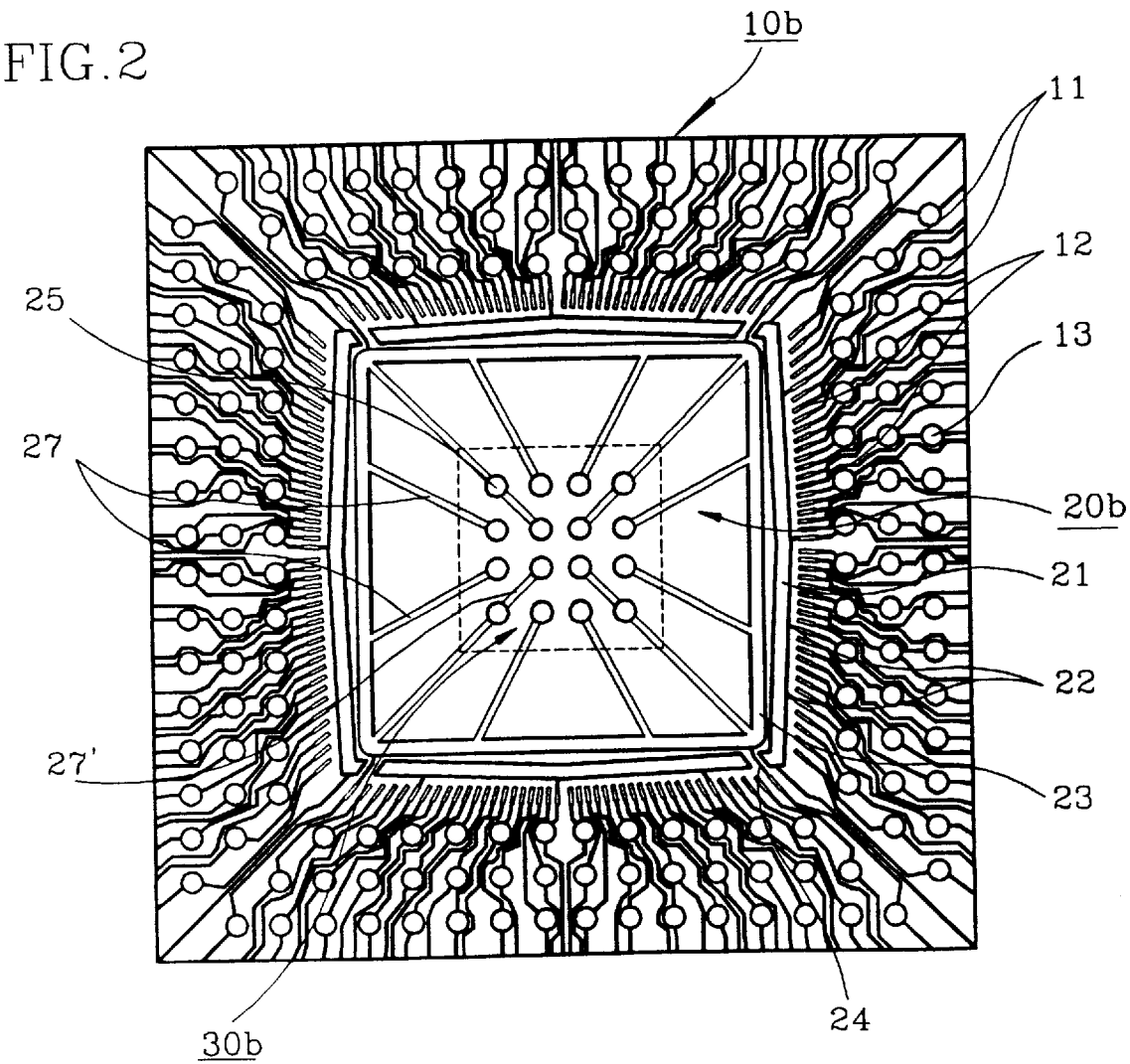

FLEXIBLE CIRCUIT BOARD FOR BALL GRID ARRAY SEMICONDUCTOR PACKAGE

RELATED APPLICATION

This application relates to U.S. Ser. No. 08/520,429 filed Aug. 29, 1995 by Won S. Shin now (U.S. Pat. No. 5,732,899) which application has the same assignee as subject application.

BACKGROUND OF THE INVENTION

1. Field of the Invention

The present invention relates, in general, to a flexible circuit board for a ball grid array (BGA) semiconductor package having a die flag, more particularly, to a flexible circuit board for a BGA semiconductor package as a semiconductor paddle using a heat spreading and grounding solder ball pad.

2. Description of the Prior Art

As well known to those skilled in the art, BGA semiconductor packages have a configuration including a printed circuit board, at least one semiconductor chip mounted on one surface of the printed circuit board, and an array of solder balls attached to the other surface of the printed circuit board and adapted to electrically connect the semiconductor chip to a conductor such as a mother board. Such BGA semiconductor packages have been widely used as multi-pin devices having 200 pins or more, integrated circuits of very large scale integration (VLSI) and microprocessors.

Typically, printed circuit boards having a thickness of several hundred microns have been used as circuit boards for BGA semiconductor packages. Recently, flexible circuit boards, in which a circuit pattern is formed on a flexible film having a thickness of several ten microns, have been highlighted. This is because such flexible circuit boards are attributed to a thin and light structure of semiconductor packages. The flexible circuit boards also achieve an improvement in workability because it is unnecessary to form via holes. The flexible circuit boards also exhibit a low thermal resistivity.

FIG. 4A is a plan view illustrating a flexible circuit board having a conventional planar die flag. This die flag, which is denoted by the reference numeral 20', comprises a semiconductor chip paddle 30' having a square or rectangular shape, and a power bonding ring or strip 21. A plurality of solder ball pads 13 are formed on the outer portion of lower surface of the die flag 20' to fuse solder balls. A plurality of conductive traces 11 are also located at the outer portion of lower surface of the die flag 20'. Each conductive trace 11 is provided at one end thereof with a wire bonding finger 12 plated with gold. Grounding traces 24 are connected to the corners of the chip paddle 30' having a square or rectangular shape, respectively. A plurality of power signal transfer traces 22 are connected to the power bonding ring or strip 21.

FIG. 4B is a sectional view of a ball grid array semiconductor package using a flexible circuit board having the planar die flag structure of FIG. 4A. In FIG. 4B, elements respectively corresponding to those in FIG. 4A are denoted by the same reference numerals.

The flexible circuit board, which is denoted by the reference numeral 10', comprises a flexible resin film 14, and a printed circuit pattern formed on the upper surface of the flexible resin film 14. The printed circuit pattern includes a plurality of electric conductive traces 11. The flexible circuit board 10' also comprises a semiconductor chip paddle 30' having a square or rectangular shape and formed on the central portion of the flexible resin film 14 surround by the printed circuit pattern, and a ground bonding rim 23 formed on the flexible resin film 14 around the chip paddle 30'. The flexible resin film 14 is perforated by a chemical etching method to define a plurality of solder ball lands on the lower surface of the solder ball pad 13 for fusing the solder balls 5.

A metal frame 6 having a rectangular ring shape is bonded to the circuit board 10' by means of an adhesive layer 7 such as epoxy resin so that the flexible circuit board 10 is maintained in a rigid state with regard to the process efficiency. The metal frame 6 also serves as a heat spreader. A semiconductor chip 2 is mounted on the chip paddle 30' located at the central portion of the circuit board 10' by means of the adhesive layer 7. The metal frame 6 is disposed on the outer portion of the flexible circuit board 10' in such a manner that it surrounds the semiconductor chip 2. The semiconductor chip 2 has bond pads which are electrically connected with the power bonding ring 21 or wire bonding fingers 12 of the conductive traces 11 by bonding wires 3. The chip 2 and the bonding wires 3, etc. are protected from the environment by means of a resin envelope 4. The solder balls 5 as input/output terminals are fused on the solder ball pads 13 at the lower surface of the flexible circuit board 10' around the semiconductor chip paddle 30'.

The substrate of the chip paddle 30' is a copper layer. However, such a copper layer exhibits an insufficient bonding property to epoxy resin which is used to form the resin envelope. Therefore, a nickel layer is plated on the upper surface of the epoxy resin layer. In addition, an expensive gold layer is plated on the upper surface of the nickel layer.

In the flexible circuit board 10' having the above-mentioned conventional die flag structure, the manufacturing costs increases because the semiconductor chip paddle 30', which is comprised of a square or rectangular plane having a relatively large area, is plated with expensive gold. Furthermore, it is difficult to absorb mechanical stress generated due to a difference in thermal expansion coefficient between different materials of package elements when heat is generated during the operation of the semiconductor chip. As a result, a cracking or bending of the complete package may occur.

Therefore, when the package is mounted on a mother board, a poor connection or short circuit may occur because of a bad coplanarity of the solder balls resulting from the cracking or bending of the package. Furthermore, where the semiconductor chip (not shown) is depressively mounted on the chip paddle 30' after dispensing a silver-filled epoxy resin having a high thermal conductivity onto the semiconductor chip paddle 30', the epoxy resin may be non-uniformly spread on the semiconductor chip paddle 30'. In this case, a generation of voids may also occur. As a result, a peeling-off phenomenon may occur at the interface between the semiconductor chip and the circuit board 10'. Also, the epoxy resin may bleed out to the vicinity of the fingers of the grounding traces 24 connected to the bonding rim 23. In this case, the power bonding ring or strip 21, grounding traces 24 or conductive traces 11 may be short-circuited by the silver contained in the bled-out epoxy resin. In addition, a degraded wire bonding may occur.

SUMMARY OF THE INVENTION

Accordingly, the present invention has been made with the above problems occurring in the prior art in mind, and a first object of the present invention is to provide a flexible circuit board for a BGA semiconductor package having a die flag structure capable of not only minimizing an area plated with gold to reduce the manufacturing costs, but also minimizing a deformation of the package occurring due to mechanical stress resulting from a difference in thermal expansion coefficient between package elements while preventing a short circuit and a degraded bonding due to a bleed-out of a silver-filled epoxy resin.

A second object of the invention is to provide a flexible circuit board for a BGA semiconductor package having a die flag structure capable of not only minimizing an area plated with gold to reduce the manufacturing costs, but also minimizing a deformation of the package occurring due to mechanical stress resulting from a difference in thermal expansion coefficient between package elements while uniformly spreading a silver-filled epoxy resin without forming voids.

A third object of the present invention is to provide a flexible circuit board for a BGA semiconductor package having a die flag structure capable of not only minimizing an area plated with gold to reduce the manufacturing costs, but also minimizing a deformation of the package occurring due to mechanical stress resulting from a difference in thermal expansion coefficient between package elements while preventing a short circuit and a degraded bonding due to a bleed-but of a silver-filled epoxy resin and uniformly spreading a silver-filled epoxy resin without forming voids.

In order to accomplish the first object, the present invention provides a flexible circuit board for a ball grid array semiconductor package comprising: a flexible resin film; a plurality of electrically conductive traces formed on an upper surface of said resin film, said conductive traces having solder ball pads; and a die flag including a semiconductor chip paddle located on a central portion of said circuit board, said chip paddle having a plurality of heat-discharging and grounding solder ball pads, and a plurality of lattice-shaped traces adapted to electrically connect said solder ball pads, said traces being shaped into a lattice to prevent a bleed-out of a silver-filled epoxy resin, a ground bonding rim located around said chip paddle, and a plurality of radial traces adapted to electrically connect said chip paddle to said ground bonding rim; and said flexible resin film being perforated to define solder ball lands on lower surfaces of said solder ball pads.

In order to accomplish the second object, the present invention provides a flexible circuit board for a ball grid array semiconductor package comprising: a flexible resin film; a plurality of electrically conductive traces formed on an upper surface of said resin film, said conductive traces having solder ball pads; and a die flag including a semiconductor chip paddle located on a central portion of said circuit board, said chip paddle having a plurality of heat-discharging and grounding solder ball pads, and a plurality of radial inner traces adapted to electrically connect the outermost ones of said solder ball pads with the inner ones of said solder ball pads, said inner traces serving to uniformly spread a silver-filled epoxy resin without forming voids, a ground bonding rim located around said chip paddle, and a plurality of radial traces adapted to electrically connect said outermost solder ball pads to said ground bonding rim, respectively; and said flexible resin film being perforated to define solder ball lands on lower surfaces of said solder ball pads.

In order to accomplish the third object, the present invention provides a flexible circuit board for a ball grid array semiconductor package comprising: a flexible resin film; a plurality of electrically conductive traces formed on an upper surface of said resin film, said conductive traces having solder ball pads; and a die flag including a semiconductor chip paddle located on a central portion of said circuit board, said chip paddle having a plurality of heat-discharging and grounding solder ball pads, and a plurality of traces adapted to electrically connect the outermost ones of said solder ball pads with the inner ones of said solder ball pads, said inner traces serving to uniformly spread a silver-filled epoxy resin without forming voids, a ground bonding rim located around said chip paddle, and a plurality of radial traces adapted to electrically connect said outermost solder ball pads to said ground bonding rim, respectively; a bleed-out preventing ring located inside said ground bonding rim adjacent to the ground bonding rim, said bleed-out preventing ring being connected to said radial traces; a ring connection trace adapted to electrically connect said preventing ring with said bonding rim; and said flexible resin film being perforated to define solder ball lands on lower surfaces of said solder ball pads.

BRIEF DESCRIPTION OF THE DRAWINGS

The above object, and other features and advantages of the present invention will be more clearly understood from the following detailed description taken in conjunction with the accompanying drawings, in which:

FIGS. 1C and 1D are plan views respectively illustrating a lattice die flag structure modified from the structure of FIG. 1A;

FIG. 2 is a plan view illustrating the structure of a radial die flag of a flexible circuit board according to second embodiment of the present invention;

DESCRIPTION OF THE PREFERRED EMBODIMENT

Figure 1A:
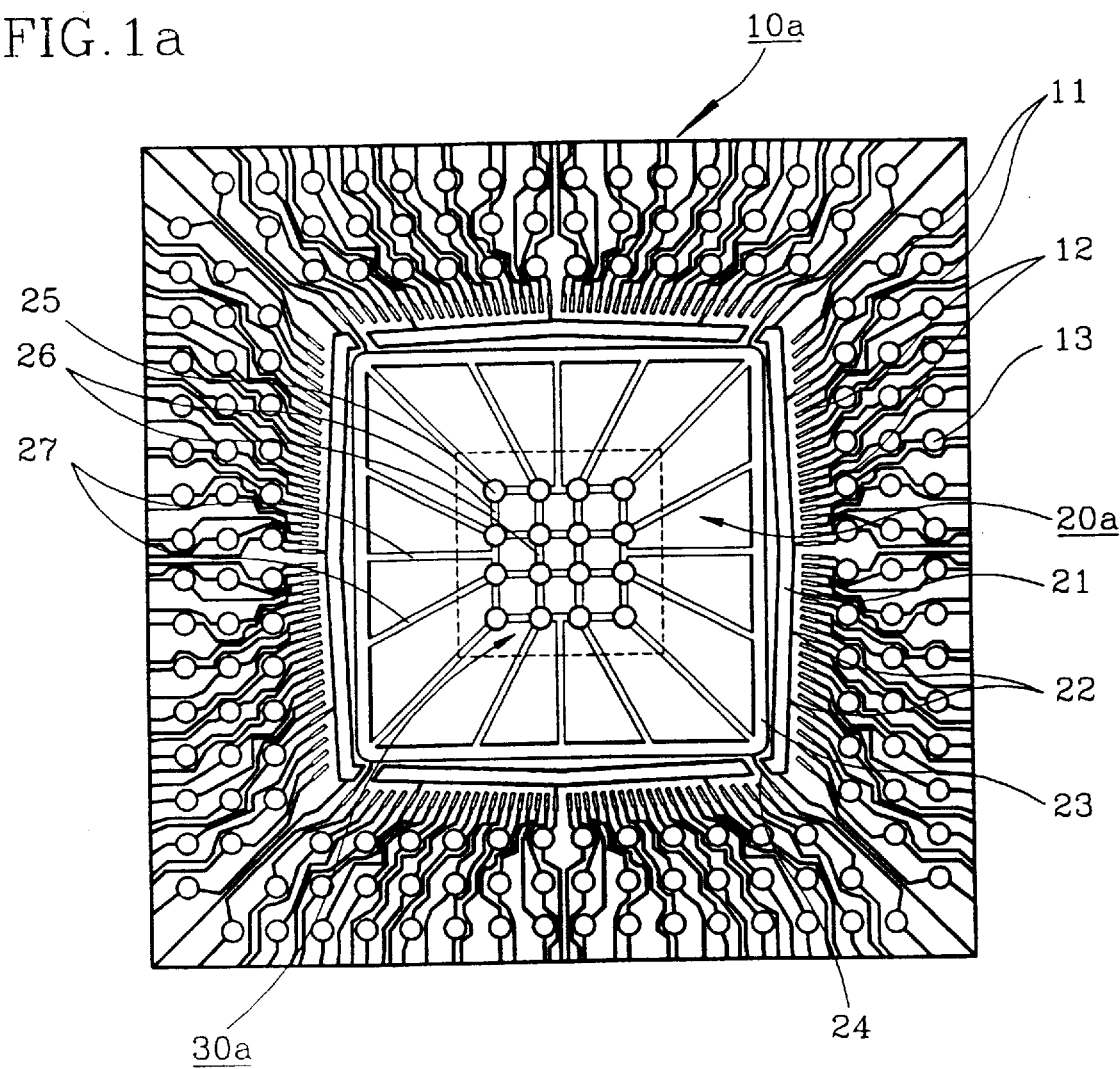
FIG. 1A is a plan view illustrating the structure of a planar die flag of a flexible circuit board according to a first embodiment of the present invention.

FIG. 1A is a plan view illustrating the structure of a planar die flag of a flexible circuit board according to a first embodiment of the present invention. For the simplicity of the illustration, the outer portion of the circuit board is omitted from FIG. 1A. In addition, this embodiment is adapted to accomplish the first object as be described above.

In this embodiment, the die flag, which is denoted by the reference numeral 20a, comprises a semiconductor chip paddle 30a, a ground bonding rim 23 and/or a power bonding ring or strip 21 located around the chip paddle 30a, and a plurality of radial traces 27. The chip paddle 30a and the ground bonding rim 23 are electrically connected by the radial traces 27.

The die flag may have only one of the bonding rim 23 and bonding ring (or strip) 21, while the other may be directly bonded to conductive traces 11. Also, the relative positions of the bonding rim 23 and bonding ring (or strip) 21 are not limited to the illustrated case in which the bonding rim 23 is located at an inner position. However, it is preferred that the elements 21 and 23 be positioned in such a manner that one having a rim shape is located on the inner portion of the circuit while the other having a strip shape is located at an outer position, in order to moderate a bleed-out of epoxy resin. As such a strip-shaped element is outwardly located, it is possible to obtain a space in which a grounding trace 24 or a power signal transmit trace 22 extend outwardly from the corners of the rim-shaped element. However, the present invention is not limited to such an arrangement. The grounding trace 24 and the power signal transmit traces 22 are connected to the bonding rim 23 and bonding ring (or strip) 21 respectively.

The semiconductor chip paddle 30a comprises a plurality of ball pads 25 having a heat discharge function and a grounding function, and a plurality of traces 26 electrically connecting the solder ball pads 25. The traces 26 are shaped into a lattice, in order to prevent a bleed-out of silver-filled epoxy resin. The chip paddle 30a is located on the center of the flexible circuit board 10a. Accordingly, it is possible to greatly reduce the area of the chip paddle 30a and to effectively disperse mechanical stress generated due to a difference in thermal expansion coefficient between different materials of package elements when heat is generated during the operation of a semiconductor chip (not shown). Therefore, there is no bending phenomenon occurring at the semiconductor chip paddle 30a. Also, there is no peeling-off or cracking phenomenon occurring at the interface between the semiconductor chip and the chip paddle 30a. The flexible resin film 14 is perforated by the chemical etching or laser beam irradiation method at their portions where the solder ball pads 25 are disposed, so that the lower surfaces of the solder ball pads 25 of the chip paddle 30a and the solder ball pads 13 of the conductive traces 11 formed peripherally of the bonding rim 23 are directly outwardly exposed. Accordingly, a high heat discharge efficiency is obtained.

The flexible circuit board 10a is comprised of a flexible resin film 14 on which a circuit pattern is formed. Preferably, the flexible resin film 14 is made of a polyimide resin exhibiting a good bonding property to epoxy resin. The flexible resin film 14 has a thickness of 20–150 $\mu$, preferably 30–80 $\mu$.

The solder ball pads 25 included in the semiconductor chip paddle 30a are made of copper. Nickel and gold are sequentially plated on the upper surfaces of the ball pads so as to improve the bonding force to epoxy resin. Also, the lattice traces 26, radial traces 27, ground bonding rim 23 and power bonding ring or strip 21 are made of copper and completely or partially plated with nickel and gold in a sequential manner so as to improve the bonding force to epoxy resin. In addition, wire bonding regions (not shown) defined on the ground bonding rim 23 and the power bonding strip 21 may be plated with gold so as to obtain an improvement in conductivity.

The ground bonding rim 23 is electrically connected with the chip paddle 30a by the radial traces 27. Also, the radial traces 27 are directly connected to the solder ball pads 25, respectively. If desired, the traces 27 may be connected to the lattice-shaped traces 26. The radial traces 27 serve to effectively discharge heat generated in the semiconductor chip through the solder ball pads 25. At the same time, the radial traces 27 electrically connect the solder ball pads 25 to the bonding rim 23, thereby grounding the semiconductor chip.

In the first embodiment, the structure of the die flag 20a on the flexible circuit board 10a comprises the semiconductor chip paddle 30a, solder ball pads 25, and lattice-shaped traces 26. Also, the chip paddle 30a is connected with the solder ball pads 25 in the form of a lattice by means of the lattice-shaped traces 26. Therefore, when the semiconductor chip is depressively mounted on the chip paddle 30 after dispensing a silver-filled epoxy resin having a high thermal conductivity, the epoxy resin is uniformly spread within the lattice while its bleed-out is prevented or moderated. Thus, no short circuit occurs.

Figure 1B:
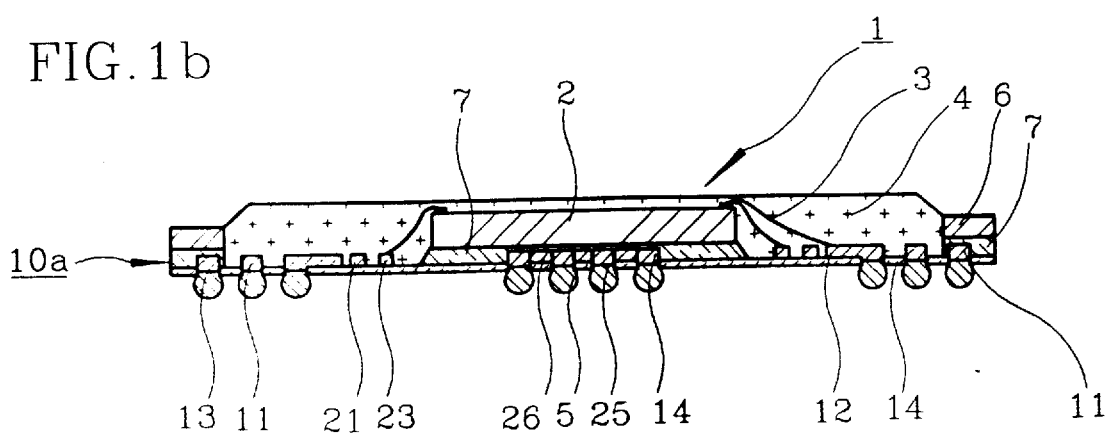
FIG. 1B is a cross-sectional view of a BGA semiconductor package including the flexible circuit board of FIG. 1A.

FIG. 1B is a cross-sectional side view of a ball grid array semiconductor package fabricated using the flexible circuit board shown in FIG. 1A. In FIG. 1B, the semiconductor package is denoted by the reference numeral 1.

As mentioned above, the circuit board 10a comprises the flexible resin film 14, the conductive traces 11 formed on the upper surface of the resin film 14, and the die flag 20a (shown in FIG. 1A). The flexible resin film 14 is denoted by the reference numeral 14 in FIG. 1B.

In order to maintain the circuit board 10a in a rigid state during the fabrication of the semiconductor package 1, a metal frame 6 having a rectangular ring shape is bonded to the circuit board 10a by means of an adhesive layer 7 such as epoxy resin. The metal frame also serves as a heat spreader in the complete semiconductor package. The metal frame 6 is provided with a large central opening. A semiconductor chip 2 is mounted on the chip paddle 30a located at the central portion of the circuit board 10a by means of the adhesive layer 7. The metal frame 6 is disposed on the outer portion of the flexible circuit board 10' in such a manner that it surrounds the semiconductor chip 2. The semiconductor chip 2 has bond pads which are electrically connected with the power bonding ring 21 or wire bonding fingers 12 of the conductive traces 11 by bonding wires 3. The chip 2 and bonding wires 3, etc. are protected from the environment by means of a resin envelope 4. The solder balls 5 as input/ output terminals are fused on the solder ball pads 13 at the lower surface of the flexible circuit board 10a around the semiconductor chip paddle 30a.

Figure 1C:
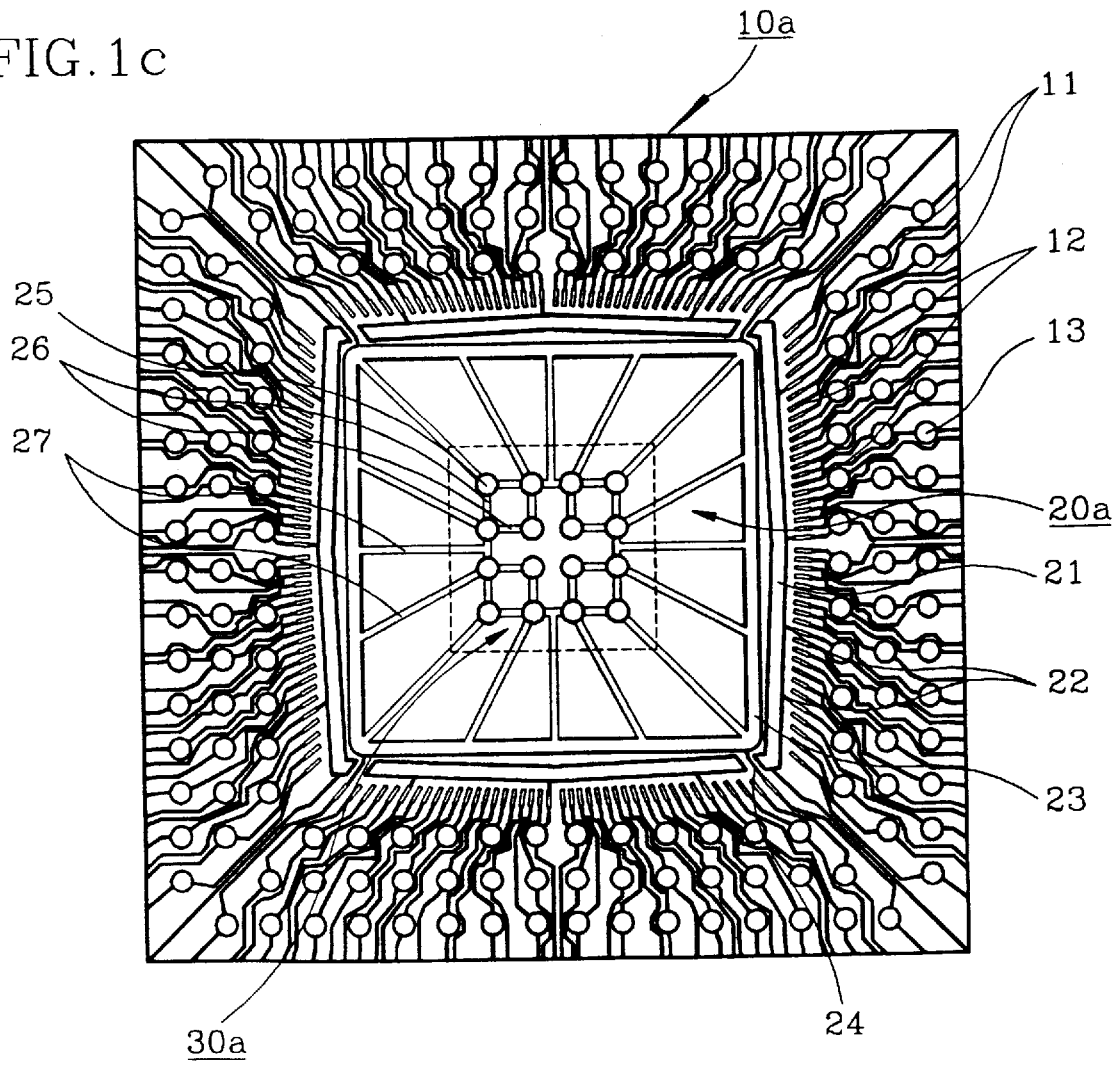

FIG. 1C and FIG. 1D are plan views respectively illustrating lattice die flag structures modified from the structure of FIG. 1A. These embodiments are adapted to accomplish the first and third objects as be described above.

In these cases, the die flag 20a on the flexible circuit board 10a has a structure in which the lattice-shaped traces 26 are partially eliminated. That is, the traces 26 connecting inner solder ball pads 25 are partially removed while the traces 26 connecting outer solder ball pads 25 remain. This trace elimination is not limited to the illustrated case. In this case, each inner solder ball pad 25 not connected to any trace must be electrically and thermally connected to at least one of the outermost solder ball pads 25. The outermost pads 25 are connected with one another by the lattice-shaped traces 26 in order to prevent a bleed-out of the silver-filled epoxy resin.

In the structure of the die flag 20a shown FIG. 1C, the lattice-shaped traces 26 connecting the solder ball pads 25 disposed at the central portion of the chip paddle 30a are removed. In this structure, the central portion of the chip paddle 30a is opened in a cross shape. Although the lattice-shaped traces 26 located on the central portion of the chip paddle 30a are completely eliminated in the case shown FIG. 1C, they may have length portions remaining at the central portion of the chip paddle 30a.

In the structure of the die flag 20a shown FIG. 1D, the lattice-shaped traces 26 connecting the solder ball pads 25 disposed at the central portion of the chip paddle 30a and the lattice-shaped trace 26 connecting the inner solder ball pads 25 to the outermost solder ball pads 25 are removed. In this structure, the central portion of the chip paddle 30a is opened in a radially spiral shape.

Since the flexible circuit board shown in FIG. 1C or 1D has a modified lattice-shaped die flag structure in which the semiconductor chip paddle plate 30a has an enlarged opened portion, it is possible to minimize the gold plated region, thereby greatly reducing the manufacturing costs. It is also possible to minimize a deformation of the package caused by mechanical stress generated due to a difference in thermal expansion coefficient between different materials of package elements. A bleed-out of the silver-filled epoxy resin is also surely prevented. It is also possible to uniformly spread the silver-filled epoxy resin without forming voids.

Figure 1E:
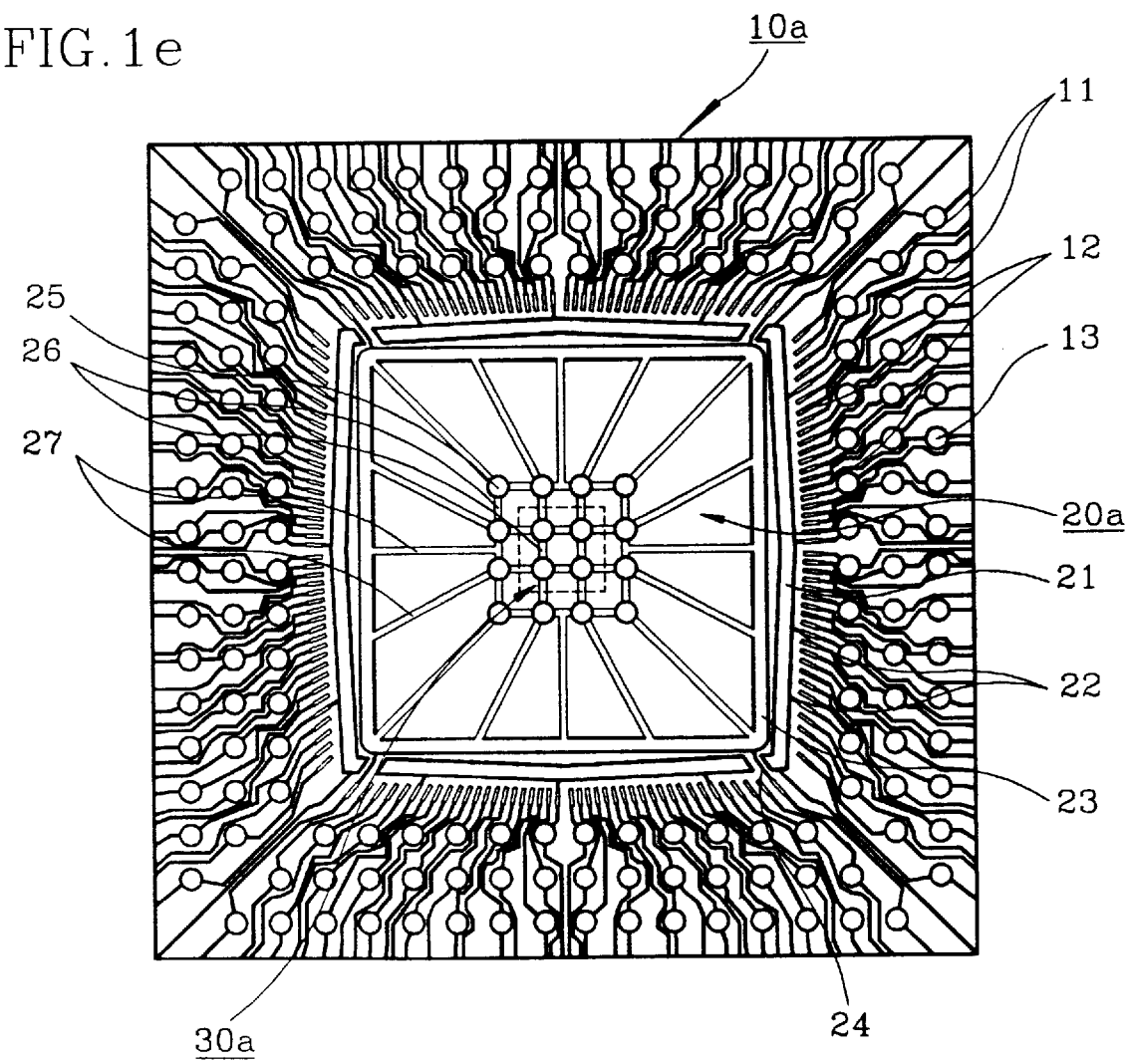
FIG. 1E is a plan view illustrating a lattice die flag structure modified from the structure of FIG. 1A, which includes heat-discharging and grounding solder ball pads located beyond a semiconductor chip paddle region.

FIG. 1E is a plan view illustrating a lattice die flag structure modified from the structure of FIG. 1A. This embodiment is adapted to accomplish the first object as be described above. This lattice-shaped die flag structure is used for compact semiconductor chips. As shown in FIG. 1E, the lattice-shaped die flag 20a includes solder ball pads 25 located beyond the semiconductor chip mounting region (indicated by the dotted line). These solder ball pads 25 surround the semiconductor chip paddle 30a, along with lattice-shaped traces 26 connecting those solder ball pads 25. In accordance with this structure, a bleed-out of silver-filled epoxy resin is surely prevented. This structure is also used for large semiconductor chips.

FIG. 2 is a plan view illustrating the structure of a die flag of a flexible circuit board according to a second embodiment of the present invention. For the simplicity of the illustration, the outer portion of the circuit board is omitted from FIG. 2. In addition, this embodiment is adapted to accomplish the second object as be described above, and the fundamental structure of this embodiment is similar to the first embodiment, thus only the difference of them will be explained below.

In this embodiment, the die flag, which is denoted by the reference numeral 20b, comprises a semiconductor chip paddle 30b, a ground bonding rim 23 and/or a power bonding ring or strip 21 located around the chip paddle 30a, and a plurality of radial traces 27. The chip paddle 30a and the ground bonding rim 23 are electrically connected by the radial traces 27.

The semiconductor chip paddle 30b comprises a plurality of solder ball pads 25 having a heat discharge function and a grounding function, and a plurality of radial inner traces 27' connecting the inner solder ball pads 25 to the outermost solder ball pads 25. The radial inner traces 27' serve to uniformly spread a silver-filled epoxy resin without forming voids. The chip paddle 30b is located on the central portion of the flexible circuit board, which is denoted by the reference numeral 10b. Furthermore, the radial inner traces 27' electrically connect two or more of the solder ball pads to one another. The inner traces 27' are electrically connected to those of the radial traces 27 aligned therewith by the outermost solder ball pads 25, respectively.

In the second embodiment, the structure of the die flag 20b does not include the lattice-shaped traces 26 as shown in the first embodiment. For this reason, the effect of preventing a bleed-out of epoxy resin may be insufficient. However, this structure includes the radial inner traces 27'. Accordingly, where the semiconductor chip is depressively mounted on the chip paddle 30b after dispensing a silver-filled epoxy resin, the epoxy resin is radially and uniformly spread within the traces without forming voids. Therefore, there is no peeling-off phenomenon occurring at the interface between the semiconductor chip and the chip paddle 30b.

Furthermore, it is possible to greatly reduce the area of the chip paddle 30b by virtue of a plurality of solder ball pads 25. It is also possible to effectively disperse mechanical stress generated due to a difference in thermal expansion coefficient between different materials of package elements when heat is generated during the operation of a semiconductor chip (not shown). Therefore, there is no bending phenomenon occurring at the semiconductor chip paddle 30b. Also, there is no peeling-off or cracking phenomenon occurring at the interface between the semiconductor chip and the chip paddle 30b. The flexible resin film 14 is perforated by the chemical etching or laser beam irradiation method at their portions where the solder ball pads 25 of the chip paddle 30a and the solder ball pads 13 of the conductive traces 11 formed peripherally of the bonding rim 23 are disposed, so that the lower surfaces of the solder ball pads 25 are directly outwardly exposed. Accordingly, a high heat discharge efficiency is obtained.

As in the first embodiment, the ground bonding rim 23 is electrically connected with the chip paddle 30b by the radial traces 27. Also, the radial traces 27 are directly connected to the solder ball pads 25, respectively. Accordingly, the radial traces 27 serve to effectively discharge heat generated in the semiconductor chip through the solder ball pads 25. At the same time, the radial traces 27 electrically connect the solder ball pads 25 to the bonding rim 23.

The solder ball pads 25 included in the semiconductor chip paddle 30b are made of copper. Nickel and gold are sequentially plated on the upper surfaces of the ball pads so as to improve the bonding force to epoxy resin. Also, the radial traces 27, radial inner traces 27', ground bonding rim 23 and power bonding ring or strip 21 are made of copper and completely or partially plated with nickel and gold in a sequential manner so as to improve the bonding force to epoxy resin. In addition, wire bonding regions (not shown) defined on the ground bonding rim 23 and the power bonding strip 21 may be plated with gold so as to obtain an improvement in conductivity.

The forming locations and shapes of the ground bonding rim 23 and the power bonding strip 21 are optional, as in the first embodiment, and the used flexible resin board is similar to the first embodiment.

Figure 3:
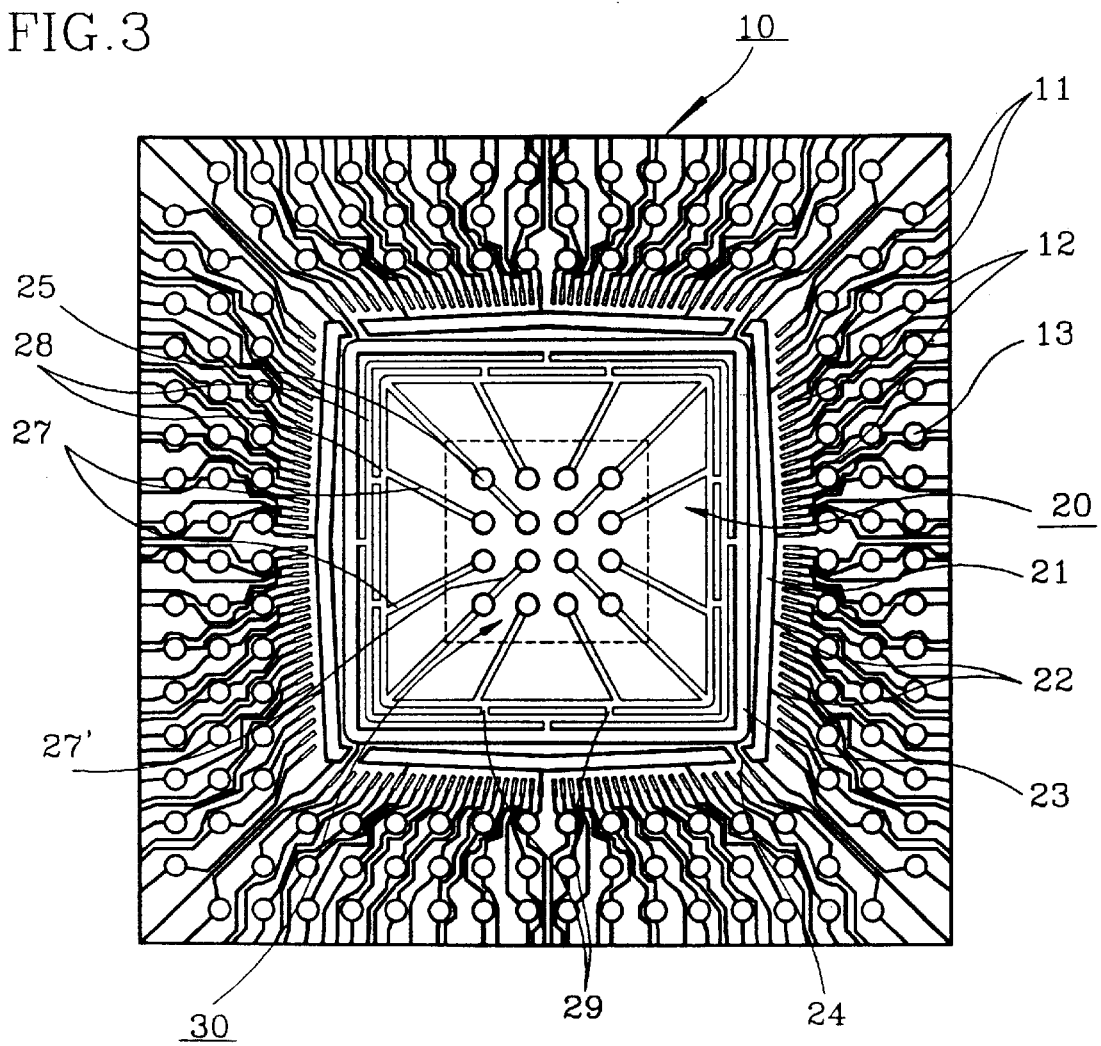
FIG. 3 is a plan view illustrating the structure of a radial die flag including a bleed-out preventing ring formed on a flexible circuit board according to a third embodiment of the present invention.
Figure 4A:
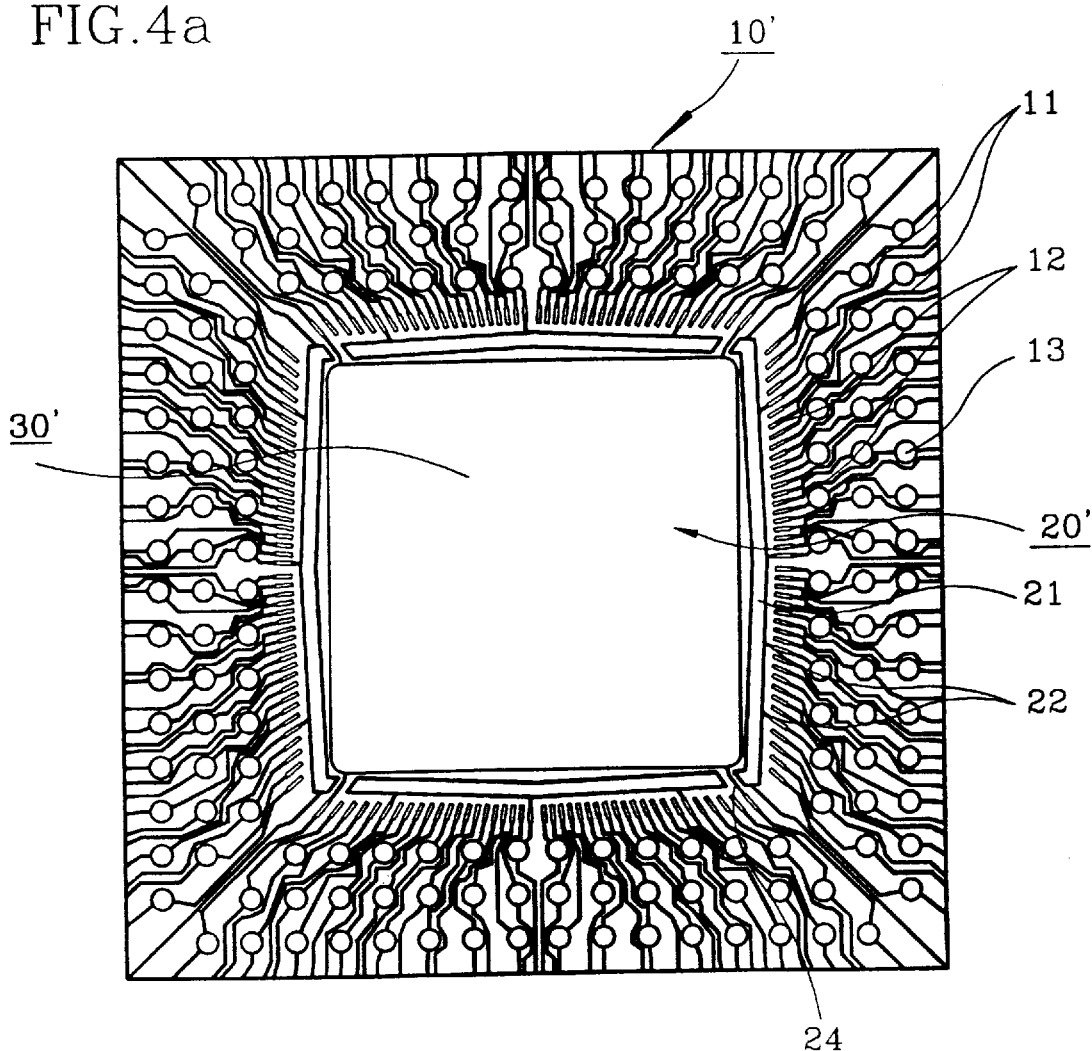
FIG. 4A is a plan view illustrating a conventional planar die flag structure of a flexible circuit board.
Figure 4B:
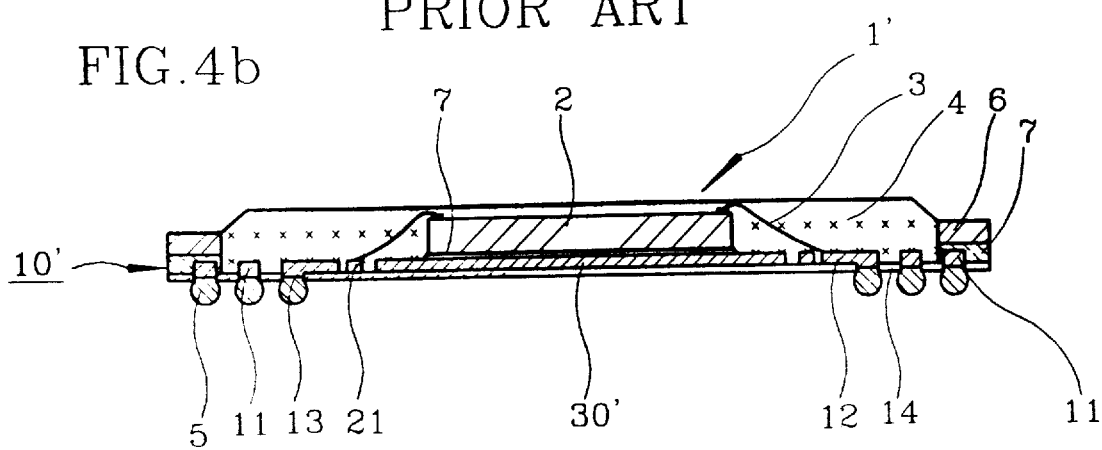
FIG. 4B is a cross-sectional view of a BGA semiconductor package using a flexible circuit board having the planar die flag structure of FIG. 4A.

FIG. 3 is a plan view illustrating the structure of a die flag of a flexible circuit board according to a third embodiment of the present invention. For the simplicity of the illustration, the outer portion of the circuit board is omitted from FIG. 3. In addition, this embodiment is adapted to accomplish the third object as be described above, and the fundamental structure of this embodiment is similar to the second embodiment, except for a bleed-out preventing ring, thus only the difference of them will be explained below.

In this embodiment, the die flag, which is denoted by the reference numeral 20, comprises a semiconductor chip paddle 30b, at least one bleed-out preventing ring 28 located around the chip paddle 30, a ground bonding rim 23 and/or a power bonding ring or strip 21 located around the bleed-out preventing ring 28, and a plurality of radial traces 27. The chip paddle 30a and the ground bonding rim 23 are electrically connected by the radial traces 27.

The forming locations and shapes of the ground bonding rim 23 and the power bonding strip 21 are optional, as in the first and second embodiments, and the used flexible resin board is similar to the first embodiment. Also, the chip paddle 30 has the same structure as the chip paddle according to the second embodiment, thus the description of the structure will be omitted below.

The bleed-out preventing ring 28 is located inside the bonding rim 23 while being spaced apart from the chip paddle 30 by a desired distance. Although a single bleed-out preventing ring 28 is provided in the illustrated case, it is preferred to provide two or more bleed-out preventing rings so as to effectively prevent a bleed-out of the silver-filled epoxy resin.

As in the first and second embodiments, the ground bonding rim 23 is electrically connected to the chip paddle 30 by the radial traces 27. However, in this embodiment, the innermost bleed-out preventing ring 28 is electrically connected to the chip paddle 30 by the radial traces 27. The radial traces 27 are directly connected to the outermost solder ball pads 25, respectively, thereby effectively spreading heat generated in the semiconductor chip.

In the case of using a single bleed-out preventing ring 28, the ring 28 is electrically connected to the bonding rim 23 by ring connection traces 29. The connection traces 29 are located at positions misaligned from positions where the radial traces 27 are electrically connected to the preventing ring 28, respectively, so that a bleed-out of the epoxy resin is effectively prevented. When the connection traces 29 are aligned with the radial traces 27, a bleed-out of the silver-filled epoxy resin may occur along the traces 27 and 29, thus, it is not preferable.

Also, in the case of using two or more preventing rings 28, the rings 28 are electrically connected to one another by ring connection traces 29. The ring connection traces 29 also electrically connect the rings 28 to the bonding rim 23. As described above, the connection traces 29 are located at positions misaligned from positions where the radial traces 27 are electrically connected to the preventing rings 28, respectively, so that a bleed-out of the epoxy resin is effectively prevented.

The solder ball pads 25, radial traces 27, radial inner traces 27', ground bonding rim 23, power bonding ring (or strip) 21, preventing ring 28 and the ring connection traces 29 included in the semiconductor chip paddle 30 are made of copper, as in the first and second embodiments. Nickel and gold are sequentially plated on the upper surfaces of the above-mentioned elements so as to improve the bonding force to epoxy resin.

As mentioned above, the present invention provides a flexible circuit board for a BGA semiconductor package having a die flag structure capable of not only minimizing an area plated with gold to reduce the manufacturing costs, but also minimizing a deformation of the package occurring due to mechanical stress resulting from a difference in thermal expansion coefficient between package elements while preventing a short circuit and a degraded bonding due to a bleed-out of a silver-filled epoxy resin and uniformly spreading a silver-filled epoxy resin without forming voids.

What is claimed is:

1. A flexible circuit board for a ball grid array semiconductor package comprising:

a flexible resin film;

a plurality of electrically conductive traces formed on an upper surface of said resin film, said conductive traces having solder ball pads; and a die flag including a semiconductor chip paddle located on a central portion of said circuit board, said chip paddle having a plurality of heat-discharging and grounding solder ball pads, and a plurality of radial inner traces adapted to electrically connect the outermost ones of said solder ball pads with the inner ones of said solder ball pads, said inner traces serving to uniformly spread a silver-filled epoxy resin without forming voids, a ground bonding rim located around said chip paddle, and a plurality of radial traces adapted to electrically connect said outermost solder ball pads to said ground bonding rim, respectively; and said flexible resin film being perforated to define solder ball lands on lower surfaces of said solder ball pads of the chip paddle and said solder ball pads of the conductive traces formed peripherally of the bonding rim.

2. The flexible circuit board as claimed in claim 1, wherein said die flag further comprises:

a bleed-out preventing ring located inside said ground bonding rim adjacent to the ground bonding rim, said bleed-out preventing ring being connected to said radial traces; and a ring connection trace adapted to electrically connect said preventing ring with said bonding rim.

3. The flexible circuit board as claimed in claim 1 or 2, wherein said die flag further comprises:

a power bonding ring located around said ground bonding rim.

4. The flexible circuit board as claimed in claim 1 or 2, wherein each of said radial traces is electrically connected with said radial inner traces aligned with said radial traces via said outermost solder ball pads, respectively.

5. The flexible circuit board as claimed in claim 4, wherein each of said radial inner traces electrically connects at least two solder ball pads to each other.

6. The flexible circuit board as claimed in claim 2, wherein said die flag includes at least two bleed-out preventing rings, and connection traces adapted to connect said bleed-out preventing rings, the connection traces being located at positions misaligned from connection positions of the radial traces while being misaligned from one another.

7. The flexible circuit board as claimed in claim 1, wherein said die flag, said solder ball pads and said conductive traces are made of copper.

8. The flexible circuit board as claimed in claim 7, wherein nickel and gold are plated in a sequential manner on the upper surfaces of said die flag, said solder ball pads and said conductive traces.

9. A flexible circuit board for a ball grid array semiconductor package comprising:

a flexible resin film;

a plurality of electrically conductive traces formed on an upper surface of said resin film, said conductive traces having solder ball pads; and a die flag including a semiconductor chip paddle located on a central portion of said circuit board, said chip paddle having a plurality of heat-discharging and grounding solder ball pads, and a plurality of lattice-shaped traces adapted to electrically connect said solder ball pads, said traces being shaped into a lattice to prevent a bleed-out of a silver-filled epoxy resin, a ground bonding rim located around said chip paddle, and a plurality of radial traces adapted to electrically connect said chip paddle to said ground bonding rim; and said flexible resin film being perforated to define solder ball lands on lower surfaces of said solder ball pads.

10. The flexible circuit board as claimed in claim 9, wherein said lattice-shaped traces have no portion electrically connecting those of said solder ball pads located inside the outermost ones of said solder ball pads to one another and electrically connecting said inner solder ball pads to said outermost solder ball pads, and each of said inner solder ball pads is electrically connected to at least one of said outermost solder ball pads.

11. The flexible circuit board as claimed in claim 9, wherein those of said lattice-shaped traces electrically connecting those of said solder ball pads located inside the outermost ones of said solder ball pads to one another and those of said lattice-shaped traces electrically connecting said inner solder ball pads to said outermost solder ball pads are partially removed, and each of said inner solder ball pads is electrically connected to at least one of said outermost solder ball pads.

12. The flexible circuit board as claimed in claim 9, wherein those of said lattice-shaped traces electrically connecting the outermost ones of said solder ball pads to one another are located around said semiconductor chip paddle.

13. The flexible circuit board as claimed in claim 9 or 10, wherein said die flag further comprises:

a power bonding ring or strip located around said ground bonding rim.

14. The flexible circuit board as claimed in claim 9 or 10, wherein said radial traces electrically connected with said chip paddle are directly connected to the outermost ones of said solder ball pads.

15. The flexible circuit board as claimed in claim 14, wherein said radial traces are also connected to said lattice-shaped traces.

16. The flexible circuit board as claimed in claim 9, wherein said die flag, said solder ball pads and said conductive traces are made of copper.

17. The flexible circuit board as claimed in claim 16, wherein nickel and gold are plated in a sequential manner on the upper surfaces of said die flag, said solder ball pads and said conductive traces.

* * * * *